United States Patent
Kim et al.

[11] Patent Number: 6,133,778
[45] Date of Patent: Oct. 17, 2000

[54] ANTI-FUSE PROGRAMMING CIRCUIT WITH CROSS-COUPLED FEEDBACK LOOP

[75] Inventors: Young Hee Kim, Pahang-shi; Kie Bong Ku, Yicheon-shi, both of Rep. of Korea

[73] Assignee: Hyundai Electronics Industries Co., Ltd., Yicheon-shi, Rep. of Korea

[21] Appl. No.: 09/342,140

[22] Filed: Jun. 29, 1999

[30] Foreign Application Priority Data

Jun. 30, 1998 [KR] Rep. of Korea ............. 98-26225

[51] Int. Cl.[7] .................................. G11C 17/00
[52] U.S. Cl. ...................... 327/525; 327/526; 327/54; 327/331; 365/225.7; 365/96; 326/10
[58] Field of Search ................ 365/200, 225.7, 365/96; 326/10; 327/525, 526, 54, 331

[56] References Cited

U.S. PATENT DOCUMENTS 5,689,455 11/1997 Mullarkey et al. .

*Primary Examiner*—Viet Q. Nguyen
*Attorney, Agent, or Firm*—Oliff & Berridge, PLC

[57] ABSTRACT

An anti-fuse programming circuit comprising an operation switching part for precharging the anti-fuse programming circuit with a half voltage to operate it, an anti-fuse connected to the operation switching part, the anti-fuse being subjected to a dielectric breakdown when it is supplied with an overcurrent, a sense signal input part for inputting a sense signal to verify a programmed state of the anti-fuse, a breakdown voltage supply part for supplying a source voltage for the dielectric breakdown of the anti-fuse, an output part for outputting a signal indicative of the programmed state of the anti-fuse in response to the sense signal inputted by the sense signal input part, a feedback part for feeding back the output signal from the output part strongly at low power and high speed, a current blocking part for blocking a current path from the breakdown voltage supply part to the anti-fuse in response to a control signal from the feedback part, a reverse current prevention part for blocking the flow of current from the feedback part to the output part, and a latch part for strongly stabilizing the anti-fuse at the level of the half voltage in response to a control signal from the output part. Current consumption can significantly be reduced in programming the anti-fuse.

9 Claims, 2 Drawing Sheets

ANTI-FUSE PROGRAMMING CIRCUIT WITH CROSS-COUPLED FEEDBACK LOOP

BACKGROUND OF THE INVENTION

1. Field of the Invention

The present invention relates in general to anti-fuse programming circuits, and more particularly to an anti-fuse programming circuit with a cross-coupled feedback loop which is capable of rapidly blocking a current path formed after an anti-fuse is programmed, so as to minimize its current consumption and stabilize its output signal at high speed.

2. Description of the Prior Art

A general fuse, when the amount of current exceeding a predetermined value flows therethrough, melts and blows due to a generated heat to form an open circuit for protection of the associated device.

On the other hand, a fuse is used in a redundancy circuit for a semiconductor memory device to replace a failed line with a spare line. In order to program the fuse used, there have been proposed various methods such as, for example, an electrical fuse method of applying an overcurrent to the fuse to melt and cut it and a laser cutting method of applying a laser beam to the fuse to burn and cut it.

Among the above methods, the laser cutting method is widely used because it is simple, reliable and easy to arrange. In this case, the fuse is made of a polysilicon wire or metal wire.

The overcurrent cutting method requires a high current driver and fuse blowing pad, resulting in an increase in occupying area. Further, a residue may be present after the cutting, thus causing a switch-off phenomenon.

In the case of cutting polysilicon using a laser beam, an error may occur in accurately applying the laser beam to the polysilicon and a residue may be present after the cutting. In this case, the laser cutting method requires a large amount of processing time, and it is difficult and inaccurate to perform. Further, the repair is impossible at a package level, resulting in a degradation in reliability.

In order to solve the above problems, there has recently been proposed a new element, or a so-called anti-fuse, which can be programmed simply even at the package level.

The anti-fuse is programmed to interconnect an upper electrode and lower electrode. Namely, the anti-fuse includes an insulating film formed between the upper and lower electrodes in such a manner that it can easily be broken down according to a dielectric breakdown voltage which is a voltage difference between the upper and lower electrodes.

In this regard, the anti-fuse is programmed to interconnect two electrodes, whereas a general fuse is programmed to disconnect them from each other.

As a result, there is a need for a circuit which is capable of programming the anti-fuse and verifying the programmed result of the anti-fuse.

SUMMARY OF THE INVENTION

Therefore, the present invention has been made in view of the above problems, and it is an object of the present invention to provide an anti-fuse programming circuit with a cross-coupled feedback loop which is capable of rapidly blocking a current path formed after an anti-fuse is programmed, so as to minimize its current consumption and stabilize its output signal at high speed.

In accordance with the present invention, the above and other objects can be accomplished by a provision of an anti-fuse programming circuit comprising operation switching means for precharging the anti-fuse programming circuit with a half voltage to operate it; an anti-fuse connected to the operation switching means, the anti-fuse being subjected to a dielectric breakdown when it is supplied with an overcurrent; sense signal input means for inputting a sense signal to verify a programmed state of the anti-fuse; breakdown voltage supply means for supplying a source voltage for the dielectric breakdown of the anti-fuse; output means for outputting a signal indicative of the programmed state of the anti-fuse in response to the sense signal inputted by the sense signal input means; feedback means for feeding back the output signal from the output means strongly at low power and high speed; current blocking means for blocking a current path from the breakdown voltage supply means to the anti-fuse in response to a control signal from the feedback means; reverse current prevention means for blocking the flow of current from the feedback means to the output means; and latch means for strongly stabilizing the anti-fuse at the level of the half voltage in response to a control signal from the output means.

The anti-fuse remains insulated at the half voltage level and it is subjected to the dielectric breakdown at the source voltage level.

At a normal state where no programming signal is inputted, the operation switching means supplies the half voltage to the anti-fuse programming circuit to precharge it with the half voltage. The half voltage is strongly stabilized by the latch means even when the precharge voltage is instable.

If the programming signal is inputted to program the anti-fuse under the above precharged condition, the breakdown voltage supply means supplies the source voltage to the anti-fuse for the dielectric breakdown thereof.

If the sense signal is inputted by the sense signal input means to verify the programmed state of the anti-fuse under the condition that the anti-fuse is programmed in the above manner, the output means outputs the signal indicative of the dielectric breakdown state of the anti-fuse.

The dielectric breakdown of the anti-fuse may result in the forming of a current path from the breakdown voltage supply means to the anti-fuse. At this time, the current blocking means functions to block such a current path in response to the control signal from the output means to prevent further current consumption.

The feedback means functions to strongly feed back the control signal from the output means for the control for the current blocking means, thereby allowing the current blocking means to block the current path at low power and high speed. The reverse current prevention means functions to block the flow of current from the feedback means to the output means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
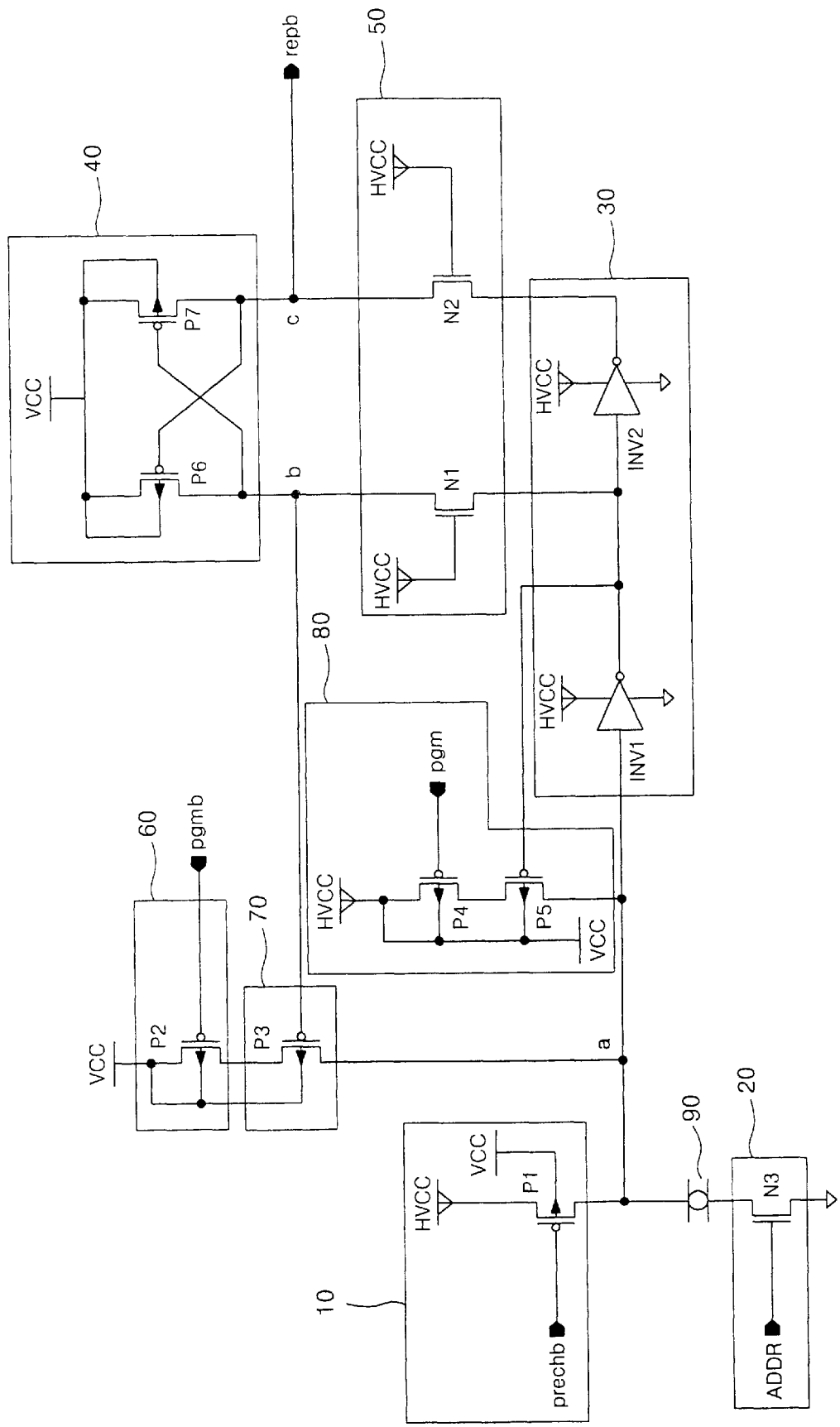
FIG. 1 is a circuit diagram showing the construction of an anti-fuse programming circuit in accordance with an embodiment of the present invention.

FIG. 1 is a circuit diagram showing the construction of an anti-fuse programming circuit which is applied to a memory device in accordance with an embodiment of the present invention.

With reference to FIG. 1, an operation switching part 10 is adapted to precharge the anti-fuse programming circuit with a half voltage HVCC to operate it. To this end, the operation switching part 10 is provided with a first PMOS transistor P1.

The first PMOS transistor P1 has its source connected to the half voltage HVCC, its drain connected to one side of an anti-fuse 90 and its gate for inputting a complementary precharge signal prechb.

A common connection point of the one side of the anti-fuse 90 and the drain of the first PMOS transistor P1 will be referred to hereinafter as a node 'a'.

A sense signal input part 20 includes a third NMOS transistor N3 having its drain connected to the other side of the anti-fuse 90, its source connected to a ground voltage terminal and its gate for inputting a failed address signal ADDR.

An output part 30 includes a first inverter INVL for inverting a signal at the node a, and a second inverter INV2 for inverting an output signal from the first inverter INV1.

The first and second inverters INV1 and INV2 are operated by the half voltage HVCC, and the output of the output part 30, or the output of the second inverter INV2, thus has the level of the half voltage HVCC when it is high in level.

A feedback part 40 includes a cross-coupled feedback loop which is operated by a source voltage VCC to rapidly feed back a variation in an output voltage repb from the anti-fuse programming circuit. To this end, the cross-coupled feedback loop is provided with sixth and seventh PMOS transistors P6 and P7. The sixth PMOS transistor P6 has its source connected to the source voltage VCC and its gate connected to a drain of the seventh PMOS transistor P7. The seventh PMOS transistor P7 has its source connected to the source voltage VCC and its gate connected to a drain of the sixth PMOS transistor P6. The drain of the sixth PMOS transistor P6 is also connected to an output terminal of the first inverter INV1 via a first NMOS transistor N1 and the drain of the seventh PMOS transistor P7 is also connected to an output terminal of the second inverter INV2 via a second NMOS transistor N2.

Hereinafter, a common connection point of the drain of the sixth PMOS transistor P6 and a drain of the first NMOS transistor N1 will be referred to as a node 'b' and a common connection point of the drain of the seventh PMOS transistor P7 and a drain of the second NMOS transistor N2 will be referred to as a node 'c'.

The first and second NMOS transistors N1 and N2 is constitute a reverse current prevention part 50. To this end, the first and second NMOS transistors N1 and N2 are connected to the half voltage HVCC at their gates so that they can always remain turned on.

If the source voltage VCC is applied respectively to the nodes b and c, current paths are formed from the nodes b and c to the first and second inverters INV1 and INV2, respectively, thereby causing current to reversely flow therethrough. However, because the first and second NMOS transistors N1 and N2 remain turned on by the half voltage HVCC, the amounts of current flowing therethrough correspond to respective differences between the half voltage HVCC and their threshold voltages Vt. As a result, current can be prevented from reversely flowing.

A breakdown voltage supply part 60 is operated in response to a complementary programming signal pgmb to supply the source voltage VCC to the node a. To this end, the breakdown voltage supply part 60 is provided with a second PMOS transistor P2.

A current blocking part 70 is adapted to interrupt a breakdown voltage for the anti-fuse 90, or the source voltage VCC supplied from the breakdown voltage supply part 60 to block a current path from the breakdown voltage supply part 60 to the anti-fuse 90 after the anti-fuse 90 is programmed. To this end, the current blocking part 70 is provided with a third PMOS transistor P3.

The second PMOS transistor P2 in the breakdown voltage supply part 60 has its drain connected to the source voltage VCC, its drain connected to a source of the third PMOS transistor P3 in the current blocking part 70 and its gate for inputting the complementary programming signal pgmb. The third PMOS transistor P3 has its drain connected to the node a and its gate connected to the node b so that it can be operated by the strong source voltage VCC.

A latch part 80 is adapted to strongly stabilize a voltage level at the node a to prevent the output of the anti-fuse programming circuit from varying in level due to an instability of that voltage level. To this end, the latch part 80 is provided with a fourth PMOS transistor P4 operated in response to a programming signal pgm, and a fifth PMOS transistor P5 operated in response to the output signal from the first inverter INV1. The fourth PMOS transistor P4 has its source connected to the half voltage HVCC and its drain connected to a source of the fifth PMOS transistor P5. The fifth PMOS transistor P5 has its drain connected to the node a.

At a normal state, the programming signal pgm is low in level and the fourth PMOS transistor P4 is thus turned on. Also, the node a is precharged with the half voltage HVCC in response to the complementary precharge signal prechb and the output of the first inverter INV1 thus goes low in level. As a result, the fifth PMOS transistor P5 is turned on to supply the half voltage HVCC to the node a, thereby stabilizing the voltage level at the node a.

If the programming signal pgm goes from low to high in level to program the anti-fuse 90, the fourth PMOS transistor P4 is turned off. The fifth PMOS transistor P5 is turned off, too, because the output of the first inverter INV1 is changed from low to high in level when the anti-fuse 90 is programmed. As a result, the fifth PMOS transistors P5 function to block a current path where current by the half voltage HVCC flows to the node a, and thus the high voltage, that is, the half voltage HVCC is latched at the output terminal of the inverter INV1.

The output repb of the anti-fuse programming circuit is provided at the node c to verify the programmed state of the anti-fuse 90.

Figure 2:
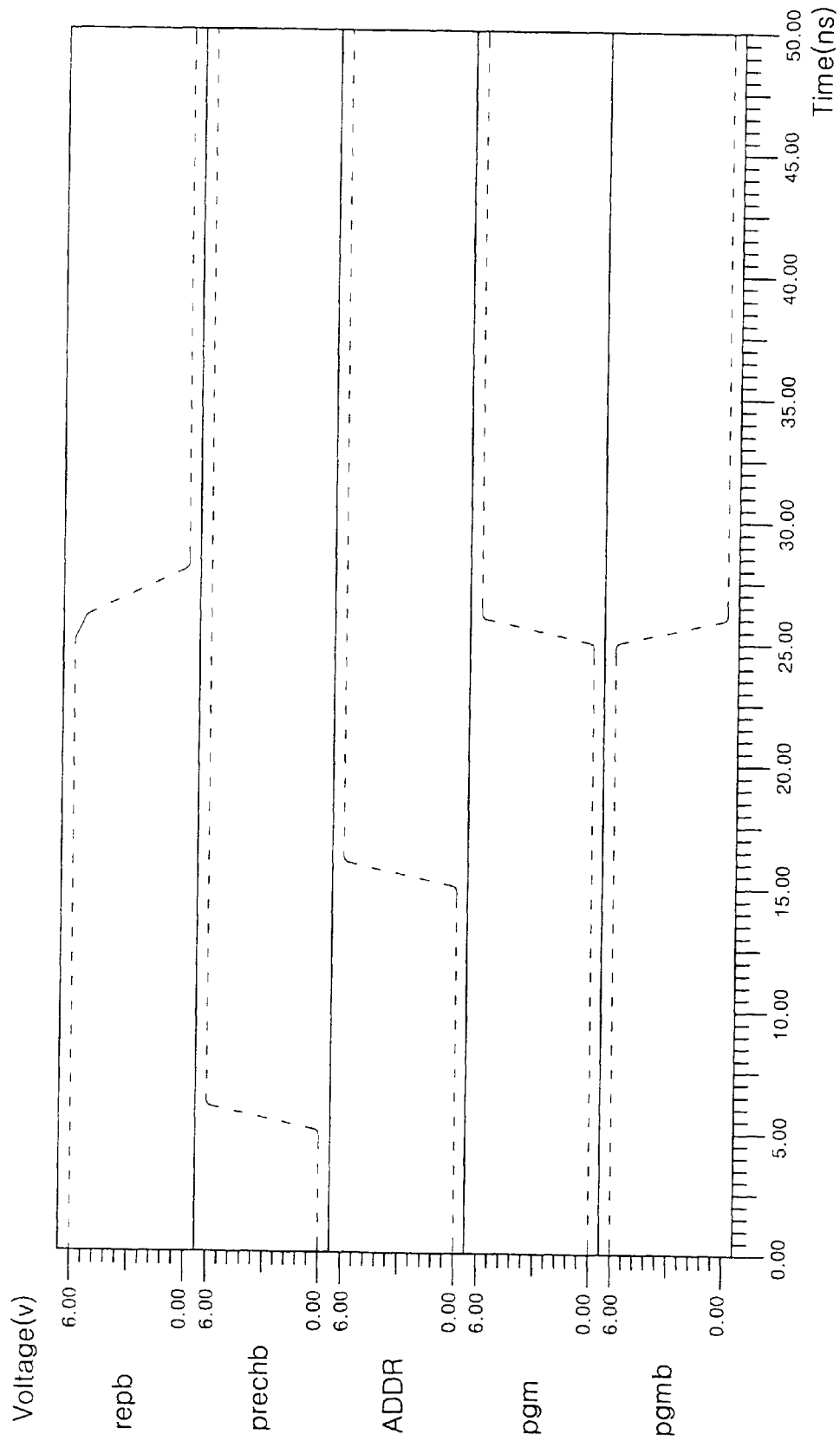
FIG. 2 is a graph showing the simulated results of input/output signals in the anti-fuse programming circuit in FIG. 1.

FIG. 2 is a graph showing the simulated results of the input/output signals in the anti-fuse programming circuit in FIG. 1.

The operation of the anti-fuse programming circuit with the above-mentioned construction in accordance with the present invention will hereinafter be described in detail with reference to FIG. 2.

First, at the normal state, the complementary precharge signal prechb becomes low in level to precharge the anti-fuse programming circuit, thereby causing the first PMOS transistor P1 in the operation switching part 10 to be turned on to supply the half voltage HVCC to the node a. As a result, the anti-fuse programming circuit is precharged with the half voltage HVCC.

Then, in the output part 30, the half voltage HVCC at the node a is inverted from high to low in level by the first inverter INV1 and again inverted from low to high in level by the second inverter INV2. As a result, the node b becomes low in level and the node c becomes high in level.

In the feedback part 40, because the node b becomes low in level, the seventh PMOS transistor P7 is turned on to transfer the source voltage VCC to the node c, resulting in the output voltage repb becoming high in level. Also, because the node c becomes high in level, the sixth PMOS transistor P6 is strongly turned off, resulting in the node b remaining low in level. This low level voltage at the node b is applied to the gate of the third PMOS transistor P3 in the current blocking part 70, thereby causing the third PMOS transistor P3 to remain turned on.

In the latch part 80, the precharged voltage, or the half voltage HVCC, at the node a is inverted from high to low in level by the first inverter INV1 and then applied to the gate of the fifth PMOS transistor P5, thereby causing the fifth PMOS transistor P5 to remain turned on.

If the complementary precharge signal prechb goes high in level and the failed address signal ADDR goes high in level under the above precharged condition, the third NMOS transistor N3 is turned on. However, because the programming signal pgm is still low in level, there is no dielectric breakdown in the anti-fuse 90 and the node a is thus not changed in voltage level.

Thereafter, when the programming signal pgm goes high in level to program the anti-fuse 90, the fourth PMOS transistor P4 in the latch part 80 is turned off to block the supply of the half voltage HVCC to the node a. Because the complementary programming signal pgmb becomes low in level, the second PMOS transistor P2 in the breakdown voltage supply part 60 is turned on to supply the source voltage VCC to the node a through the third PMOS transistor P3. As a result, a current path is formed from the node a to the ground voltage terminal through the anti-fuse 90 and the turned-on third NMOS transistor N3, thus causing a dielectric breakdown in the anti-fuse 90. Therefore, the anti-fuse 90 is programmed due to the dielectric breakdown.

If the dielectric breakdown occurs in the anti-fuse 90 in the above manner, the node a is changed from high to low in level and then inverted from low to high in level by the first inverter INV1. This high level output of the first inverter INV1 is transferred to the node b through the first NMOS transistor N1 to make it high in level. The fifth PMOS transistor P5 is turned off in response to the high level output of the first inverter INV1 to prevent current from reversely flowing due to the source voltage VCC at the node a.

Further, the high level voltage at the node b turns off the third PMOS transistor P3 which was previously turned on to supply the source voltage VCC to the node a through the breakdown voltage supply part 60. As a result, the current path resulting from the programming of the anti-fuse 90 is blocked so that no further current can flow therethrough.

The third PMOS transistor P3 is strongly turned off by the source voltage VCC from the feedback part 40. As a result, the feedback part 40 functions to rapidly turn off the third PMOS transistor P3 and maintain it stably.

If the anti-fuse 90 is programmed due to the dielectric breakdown in the above manner, the node a becomes low in level according to the turning-on of the third NMOS transistor N3. This low level voltage at the node a is high-inverted by the first inverter INV1 and again low-inverted by the second inverter INV2. This low level output of the second inverter INV2 is transferred to the node c, resulting in the output voltage repb becoming low in level.

The low level voltage at the node c turns on the sixth PMOS transistor P6 to make the node b high in level. As a result, the seventh PMOS transistor P7 is turned off to maintain the output of the second inverter INV2 as it is. In this manner, the output value of the anti-fuse programming circuit is rapidly stabilized and the current blocking part 70 is more strongly operated by the source voltage VCC from the feedback part 40 than the half voltage HVCC from the second inverter INV2, thus preventing current consumption.

As apparent from the above description, according to the present invention, the anti-fuse can be programmed in a dielectric breakdown manner at a package step of a semiconductor device to interconnect two electrodes. This results in an improvement in reliability.

Further, the source voltage-driven cross-coupled feedback loop is provided in the output part for verifying the programmed state of the anti-fuse. Therefore, the current path formed after the anti-fuse is programmed can be blocked strongly at low power and high speed, resulting in a significant reduction in current consumption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An anti-fuse programming circuit comprising:
   operation switching means for precharging said anti-fuse programming circuit with a half voltage to operate it;
   an anti-fuse connected to said operation switching means, said anti-fuse being subjected to a dielectric breakdown when it is supplied with an overcurrent;
   sense signal input means for inputting a sense signal to verify a programmed state of said anti-fuse;
   breakdown voltage supply means for supplying a source voltage for the dielectric breakdown of said anti-fuse;
   output means for outputting a signal indicative of the programmed state of said anti-fuse in response to said sense signal inputted by said sense signal input means;
   feedback means for feeding back the output signal from said output means strongly at low power and high speed;
   current blocking means for blocking a current path from said breakdown voltage supply means to said anti-fuse in response to a control signal from said feedback means;
   reverse current prevention means for blocking the flow of current from said feedback means to said output means; and
   latch means for strongly stabilizing said anti-fuse at the level of said half voltage in response to a control signal from said output means.

2. An anti-fuse programming circuit as set forth in claim 1, wherein said operation switching means includes a PMOS transistor connected between a half voltage terminal and said anti-fuse, said PMOS transistor being operated in response to a precharge signal.

3. An anti-fuse programming circuit as set forth in claim 1, wherein said sense signal input means includes an NMOS transistor connected between said anti-fuse and a ground voltage terminal, said NMOS transistor being operated in response to said sense signal.

4. An anti-fuse programming circuit as set forth in claim 1, wherein said breakdown voltage supply means includes a PMOS transistor connected between a source voltage terminal and said current blocking means, said PMOS transistor being operated in response to a programming signal.

5. An anti-fuse programming circuit as set forth in claim 1, wherein said output means includes:
   a first inverter connected to said anti-fuse, said first inverter being supplied with said half voltage to invert an output signal from said anti-fuse and output the inverted signal as said control signal to said latch means; and
   a second inverter supplied with said half voltage to invert said control signal from said first inverter and output the inverted signal as said signal indicative of the programmed state of said anti-fuse.

6. An anti-fuse programming circuit as set forth in claim 1, wherein said current blocking means includes a PMOS transistor connected between an output terminal of said breakdown voltage supply means and said anti-fuse, said PMOS transistor being operated in response to said control signal from said feedback means.

7. An anti-fuse programming circuit as set forth in claim 1, wherein said feedback means includes a cross-coupled feedback loop operated by said source voltage to strongly maintain an output voltage from said output means when said output means is operated by said half voltage.

8. An anti-fuse programming circuit as set forth in claim 1, wherein said reverse current prevention means includes a transistor operated by said half voltage to prevent an output voltage from said feedback means from being transferred to said output means when said feedback means is operated by said source voltage.

9. An anti-fuse programming circuit as set forth in claim 1, wherein said latch means includes:
   a first PMOS transistor operated in response to a programming signal to supply said half voltage to said anti-fuse; and
   a second PMOS transistor connected in series to said first PMOS transistor, said second PMOS transistor controlling a current path from said anti-fuse to a half voltage terminal in response to said control signal from said output means.

* * * * *